(12) United States Patent
Lee (10) Patent No.: US 11,387,117 B2
(45) Date of Patent: Jul. 12, 2022

(54) COMPONENT CARRIER WITH INCLUDED ELECTRICALLY CONDUCTIVE BASE STRUCTURE AND METHOD OF MANUFACTURING

(71) Applicant: AT&S Austria Technologie & Systemtechnik Aktiengesellschaft, Leoben (AT)

(72) Inventor: Minwoo Lee, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/709,752

(22) Filed: Dec. 10, 2019

(65) Prior Publication Data
US 2020/0203185 A1 Jun. 25, 2020

(30) Foreign Application Priority Data
Dec. 19, 2018 (CN) .......................... 201811567146.9

(51) Int. Cl.
*H05K 1/02* (2006.01)
*H05K 1/05* (2006.01)
(Continued)

(52) U.S. Cl.
CPC ...... *H01L 21/4871* (2013.01); *H01L 21/4803* (2013.01); *H01L 23/3675* (2013.01);
(Continued)

(58) Field of Classification Search
CPC ... H05K 1/02; H05K 1/05; H05K 1/11; H05K 1/18; H01L 21/00; H01L 21/02; H01L 21/48; H01L 21/50; H01L 21/56; H01L 21/78; H01L 23/00; H01L 23/28; H01L 23/31; H01L 23/34; H01L 23/36; H01L 23/48; H01L 23/367; H01L 23/373;
(Continued)

(56) References Cited

U.S. PATENT DOCUMENTS 5,403,784 A * 4/1995 Hashemi ............. H01L 21/4842
257/E23.042
5,756,379 A * 5/1998 Haghiri-Tehrani .........................
G06K 19/07743
438/126

(Continued)

FOREIGN PATENT DOCUMENTS

WO      2015076373 A1      5/2015

OTHER PUBLICATIONS

Lo, Frederick et al.; Recent Advances in Die Attach Film; accessible on the Internet at https://www.aitechnology/products/dieattach/; as captured electronically on Dec. 11, 2019; pp. 1-6; Ai Technology, Inc.; Princeton Junction NJ, 08550, U.S.A.
(Continued)

*Primary Examiner* — Xiaoliang Chen
(74) *Attorney, Agent, or Firm* — Robert A. Blaha; Smith Tempel Blaha LLC (57) ABSTRACT

A component carrier having a base structure consisting of an electrically conductive material, an electronic component arranged on the base structure and a surrounding structure on the base structure, where the surrounding structure at least partially surrounds the electronic component laterally.

18 Claims, 4 Drawing Sheets

(51) Int. Cl.
| | |
|---|---|
| *H05K 1/09* | (2006.01) |
| *H05K 1/11* | (2006.01) |
| *H05K 1/16* | (2006.01) |
| *H05K 1/18* | (2006.01) |
| *H01L 23/00* | (2006.01) |
| *H01L 23/13* | (2006.01) |
| *H01L 23/28* | (2006.01) |
| *H01L 23/31* | (2006.01) |
| *H01L 23/34* | (2006.01) |
| *H01L 23/36* | (2006.01) |
| *H01L 23/48* | (2006.01) |
| *H01L 23/367* | (2006.01) |
| *H01L 23/373* | (2006.01) |
| *H01L 23/488* | (2006.01) |
| *H01L 23/495* | (2006.01) |
| *H01L 23/498* | (2006.01) |
| *H01L 23/538* | (2006.01) |
| *H01L 33/00* | (2010.01) |
| *H01L 33/36* | (2010.01) |
| *H01L 33/46* | (2010.01) |
| *H01L 33/48* | (2010.01) |
| *H01L 33/50* | (2010.01) |
| *H01L 33/54* | (2010.01) |
| *H01L 33/58* | (2010.01) |
| *H01L 33/60* | (2010.01) |
| *H01L 33/62* | (2010.01) |
| *H01L 33/64* | (2010.01) |
| *H01L 21/48* | (2006.01) |

(52) U.S. Cl.
CPC .......... *H01L 23/3736* (2013.01); *H01L 24/02* (2013.01); *H01L 2224/0231* (2013.01); *H01L 2224/0233* (2013.01)

(58) Field of Classification Search
CPC ..... H01L 23/488; H01L 23/498; H01L 33/00; H01L 33/36; H01L 33/46; H01L 33/48; H01L 33/54; H01L 33/58; H01L 33/62; H01L 33/64
USPC .... 361/748, 737; 257/98, 99, 100, 728, 707, 257/738, 676; 313/512; 174/252
See application file for complete search history.

(56) References Cited

U.S. PATENT DOCUMENTS

| | | | | |
|---|---|---|---|---|
| 5,969,951 | A * | 10/1999 | Fischer | G06K 19/07745 235/492 |
| 8,942,004 | B2 * | 1/2015 | Hong | H01L 23/5389 361/763 |
| 8,994,168 | B2 * | 3/2015 | Sato | H01L 23/4334 257/713 |
| 9,368,697 | B2 * | 6/2016 | Won | H01L 33/58 |
| 10,043,726 | B2 * | 8/2018 | Sugiyama | H01L 23/3121 |
| 10,079,198 | B1 * | 9/2018 | Cadag | H01L 23/49541 |
| 10,631,413 | B1 * | 4/2020 | Chao | H01L 23/552 |
| 2001/0054481 | A1 | 12/2001 | Harada et al. | |
| 2003/0134455 | A1 | 7/2003 | Cheng et al. | |
| 2004/0036169 | A1 * | 2/2004 | Higuchi | H01L 23/66 257/728 |
| 2004/0065894 | A1 * | 4/2004 | Hashimoto | H01L 33/642 257/100 |
| 2005/0001329 | A1 * | 1/2005 | Matsuki | H01L 24/20 257/777 |
| 2005/0073846 | A1 * | 4/2005 | Takine | H01L 33/64 362/296.04 |
| 2006/0054352 | A1 * | 3/2006 | Ryu | H05K 1/185 174/260 |
| 2006/0087037 | A1 | 4/2006 | Hsu | |
| 2006/0105496 | A1 | 5/2006 | Chen et al. | |
| 2007/0074900 | A1 | 4/2007 | Lee et al. | |
| 2008/0006928 | A1 | 1/2008 | Miyazaki et al. | |
| 2008/0099917 | A1 * | 5/2008 | Jiang | H01L 23/5389 257/738 |
| 2008/0149373 | A1 | 6/2008 | Kim et al. | |
| 2008/0297047 | A1 * | 12/2008 | Kohno | H01L 33/56 313/512 |
| 2009/0039486 | A1 * | 2/2009 | Shimazaki | H01L 21/568 257/676 |
| 2009/0091021 | A1 * | 4/2009 | Nakamura | H01L 24/92 257/707 |
| 2009/0108282 | A1 * | 4/2009 | Matsuda | H01L 33/508 257/98 |
| 2009/0189270 | A1 * | 7/2009 | Wang | H01L 25/105 257/690 |
| 2009/0294052 | A1 * | 12/2009 | Chang | B32B 37/226 156/278 |
| 2010/0224903 | A1 * | 9/2010 | Cho | H01L 33/60 257/99 |
| 2010/0270579 | A1 * | 10/2010 | Jo | H01L 33/64 257/99 |
| 2010/0308451 | A1 | 12/2010 | Kodani | |
| 2011/0018123 | A1 | 1/2011 | An et al. | |
| 2011/0100681 | A1 * | 5/2011 | Kimmich | H01L 23/3677 174/252 |
| 2012/0160549 | A1 * | 6/2012 | Kim | H05K 1/185 174/257 |
| 2013/0009190 | A1 * | 1/2013 | Memida | H01L 33/486 257/98 |
| 2013/0127034 | A1 * | 5/2013 | Hasegawa | H01L 23/047 257/676 |
| 2014/0084322 | A1 * | 3/2014 | Park | H01L 33/486 257/98 |
| 2014/0312514 | A1 * | 10/2014 | Yasunaga | H01L 23/3731 257/782 |
| 2014/0367718 | A1 * | 12/2014 | Park | H01L 33/48 257/98 |
| 2015/0034374 | A1 | 2/2015 | Shimizu et al. | |
| 2015/0295141 | A1 * | 10/2015 | Schwarz | H01L 33/483 362/296.01 |
| 2016/0056358 | A1 * | 2/2016 | Moosburger | H01L 33/647 257/99 |
| 2016/0064329 | A1 | 3/2016 | Lee et al. | |
| 2016/0211221 | A1 * | 7/2016 | Kim | H01L 23/5384 |
| 2016/0233166 | A1 | 8/2016 | Teh et al. | |
| 2016/0336489 | A1 * | 11/2016 | Nishimura | H05B 45/00 |
| 2016/0366766 | A1 * | 12/2016 | Yeh | H05K 1/0298 |
| 2017/0162467 | A1 * | 6/2017 | Ellis | H01L 23/3731 |
| 2017/0222094 | A1 * | 8/2017 | Haiberger | H01L 33/62 |
| 2017/0251551 | A1 | 8/2017 | Chang et al. | |
| 2017/0273195 | A1 | 9/2017 | Pen | |
| 2017/0330814 | A1 | 11/2017 | Kang et al. | |
| 2017/0358462 | A1 * | 12/2017 | Araki | H01L 21/561 |
| 2018/0040780 | A1 * | 2/2018 | Hirasawa | H01L 33/486 |
| 2018/0166356 | A1 * | 6/2018 | Butt | H01L 23/5383 |
| 2018/0233432 | A1 * | 8/2018 | Kim | H01L 23/16 |
| 2018/0315674 | A1 * | 11/2018 | Chen | H01L 23/3128 |
| 2018/0324969 | A1 * | 11/2018 | Onitsuka | H01L 23/057 |
| 2018/0342657 | A1 * | 11/2018 | Tran | H01L 33/62 |
| 2019/0013284 | A1 * | 1/2019 | Fang | H01L 23/055 |
| 2019/0080979 | A1 * | 3/2019 | Tonedachi | H01L 23/3735 |
| 2019/0334063 | A1 * | 10/2019 | Kim | H01L 33/62 |
| 2020/0105731 | A1 * | 4/2020 | Aleksov | H01L 24/83 |
| 2020/0279982 | A1 * | 9/2020 | Lim | H01L 33/20 |

OTHER PUBLICATIONS

Lo, Frederick et al.; Recent Advances in Die Attach Film; accessible on the Internet at https://www.aitechnology.com/products/dieattach/; as captured electronically on Dec. 11, 2019; pp. 1-6; Ai Technology, Inc.; Princeton Junction NJ, 08550, U.S.A.

Dardel, Blaise; Extended European Search Report in Application 19215332.8; pp. 1-8; dated May 25, 2020; European Patent Office; 80298, Munich, Germany.

(56) References Cited

OTHER PUBLICATIONS

Dardel, Blaise; Communication Pursuant to Article 94(3) EPC in Application 19215332.8; pp. 1-9; Mar. 7, 2022; European Patent Office; 80298, Munich, Germany.

* cited by examiner

COMPONENT CARRIER WITH INCLUDED ELECTRICALLY CONDUCTIVE BASE STRUCTURE AND METHOD OF MANUFACTURING

TECHNICAL FIELD

Embodiments of the invention generally relate to a component carrier, a method of manufacturing the component carrier, and a method of using a copper layer in the component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions. In particular, providing an efficient heat dissipation from an electronic component in a robust component carrier, which is not affected by mechanical deformation such as warpage, is still a challenge.

SUMMARY

There may be a need to provide a robust component carrier, wherein heat is efficiently dissipated from an electronic component of the component carrier.

A component carrier, a method of manufacturing the component carrier, and a method of using a copper layer in the component carrier according to the independent claims are provided.

According to an exemplary embodiment of the invention, a component carrier is provided, wherein the component carrier comprises: i) a base structure consisting of an electrically conductive material, ii) an electronic component arranged on the base structure, and iii) a surrounding structure on the base structure, wherein the surrounding structure at least partially surrounds the electronic component laterally.

According to another exemplary embodiment of the invention, a method for manufacturing the component carrier is provided. The method comprises: i) forming a base structure consisting of an electrically conductive material, ii) placing an electronic component on the base structure, and iii) forming a surrounding structure on the base structure such that the surrounding structure at least partially surrounds the electronic component laterally.

According to another exemplary embodiment of the invention, a method of using is provided of a copper layer, fabricated by electroplating and located directly below an embedded component in a, in particular coreless, component carrier, as a heat dissipation and stiffening structure for said component carrier.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board (PCB), an organic interposer, a substrate-like-PCB (SLP), and an IC (integrated circuit) substrate. A component carrier may also be a hybrid board combining different ones of the above-mentioned types of component carriers.

In the context of the present application, the term "base structure" may particularly denote any structure which is made of electrically conductive material and which is suitable for forming a base for an electronic component and at least one build-up structure, e.g. an electrically insulating structure. In a preferred embodiment, the base structure is formed as a metal layer, e.g. by (electro-) plating copper on a detach core, a coreless component carrier, or a layer stack. The base structure then serves as a base for the placing of an electronic component such as a die or an IC. The base structure may hereby be made of a material which is thermally highly conductive, e.g. copper. In this manner, the base structures may provide two advantageous effects at the same time: i) serve as a heat dissipation structure for the electronic component, and ii) serve as a stiffening layer for the component carrier. The thickness of a base structure is for example in the range 30 µm to 150 µm.

In the context of the present application, the term "surrounding structure" may particularly denote any structure that is suitable to be placed onto the base structure, as described above, and to surround at least partially an electronic component which has been arranged on the base structure. In a preferred embodiment, the surrounding structures may be formed as a layer, e.g. by adhesive, lamination or plating, which layer is then patterned in order to provide a cavity to accommodate the electronic component. For example, the cavity may be patterned by laser drilling of the layer structure in order to obtain the surrounding structure. The cavity may for example be round or rectangular in shape. The electronic component comprises sidewalls and a structure, that at least partially surround said sidewalls, and may laterally surround the electronic component. Hereby, there may be a gap between the sidewalls of the electronic component and the surrounding structure. The surrounding structure may for example be an electrically conductive structure, e.g. a patterned copper layer, which has been electroplated onto the base structure. In another embodiment, the surrounding structure may be an electrically insulating structure which is covered by an electrically conductive layer such that the electrically conductive layer faces the sidewalls of the electronic component. In another embodiment, the surrounding structures may be described as an electrically conductive surrounding structure that at least partially surrounds the sidewalls of the electronic component.

In the context of the present application, the term "cavity" may denote any opening in a layer stack which is suitable to at least partially accommodate an electronic component. For example, a layer stack may be provided with a plurality of electrically insulating and electrically conductive structures. The cavity in this layer stack may be manufactured for example using a laser. Especially, the metal layers may be removed by etching. In principle, every material removal method can be applied which enables the fabrication of a cavity in the layer stack, such that the electronic component may be placed into it. In another example, the cavity may be formed by laminating and/or plating a patterned structure, such that there is a recessed portion which then forms the cavity.

According to an exemplary embodiment, the invention is based on the idea that with the implementation of an additional electrically conductive base structure below (in particular directly below) an electronic component, a component carrier can be provided, wherein at the same time an efficient heat dissipation from the electronic component can be achieved, while the component carrier is at the same time robust against bending and warpage. Said electrically conductive base structure (e.g. a metal plate) may be formed (e.g. by electroplating on a detach core) such that an electronic component can be placed on the base structure. Hereby, a surrounding structure is arranged on the base structure and laterally around the electronic component (e.g. by forming an additional layer and then drilling a cavity for the electronic component into said additional layer). In further process steps, the electronic component may for example be embedded by electrically insulating material and electrically connected by interconnection vias, i.e. further build-up methods may be performed. The electrically conductive base structure, e.g. a metal plate, may hereby function as a (metal) stiffener included into the component carrier which stiffens the component carrier, making it more stable, less bendable and avoids the formation of warpage. At the same time, however, the electrically conductive base structure functions as a heat dissipation structure, which may very efficiently transport heat produced by the electronic component away from the electronic component. For example, the electrically conductive base structure may be configured as a copper plate with a high thermal conductivity. Because the base structure is arranged below the electronic component, the heat may be very efficiently dissipated from the electronic component. As a consequence, a very robust component carrier may be provided, wherein the heat produced by an (embedded) electronic component may be efficiently dissipated. This may be done in a very cost-efficient manner which is not unnecessarily complex. Furthermore, the manufacturing method may be easily implemented into established production lines. General build-up processes, especially coreless build-up processes, can be directly applied, thereby saving additional costs and efforts.

In the following, further exemplary embodiments of the method and the component carrier will be explained.

According to an exemplary embodiment, the component carrier is a coreless component carrier. This may provide the advantage that a very thin, and thus versatile, component carrier is provided which is still very robust and has an excellent heat dissipation for electronic components.

It may be inherent to a coreless component carrier that no electrically insulating material core structure (e.g. in case of copper clad laminate (CCL)) is provided, thereby making the coreless component carrier a very thin structure. Such coreless component carriers have many advantages because they can for example be flexibly built into small accommodation spaces. However, coreless component carriers tend to have deformation problems such as warpage, because they are very thin and thus not as robust as core-structures. Furthermore, coreless component carriers may be easily overheated as they often lack space for providing heat pipes or other heat dissipation structures.

According to an exemplary embodiment of the invention, however, as described above, a coreless component carrier can be provided in an easy and cost-efficient manner, which coreless component carrier is very robust against mechanical deformation and comprises an efficient heat dissipation.

According to a further exemplary embodiment, the surrounding structure comprises an electrically conductive structure which is formed as a layer structure on the base structure, wherein the electrically conductive structure comprises a cavity, and wherein the electronic component is arranged in said cavity. This may provide the advantage that the surrounding structure is formed in a straightforward manner that can easily be implemented into established production lines. Furthermore, this may provide the advantage that the component carrier is especially robust and heat dissipation is further enhanced.

The electrically conductive structure may be formed by plating, electroplating (galvanic plating), electro-less plating, or a combination thereof. This step may be easily implemented into a component carrier manufacturing procedure. The electrically conductive structure may be formed directly with the step of forming the base structure, in particular in the same manner. The electrically conductive structure may be provided as a continuous layer and the cavity may be formed by removing material, e.g. drilling. In another embodiment, the electrically conductive structure may be formed as a patterned layer, wherein a recess forms the cavity. The massive (metal) structure consisting of the base structure and the electrically conductive structure may make the component carrier especially robust and function as a very efficient stiffener. The electrically conductive structure around the electronic component may further provide heat dissipation functionality.

According to a further exemplary embodiment, the surrounding structure comprises an electrically insulating structure which is formed as a layer structure on the base structure, wherein the electrically insulating structure comprises a cavity, and wherein the electronic component is arranged in said cavity. This may also provide the advantage that the surrounding structure is formed in a straightforward manner that can easily be implemented into established production lines.

The electrically insulating structure, e.g. PID (photo-imageable dielectric), an epoxy-based build-up material, a mold film, prepreg, or a resin, may be formed on the base structure for example by lamination. In an embodiment, the electrically insulating structure may be provided as a continuous layer, and the cavity is formed in this layer by removing material, e.g. by drilling. In another embodiment, the electrically insulating structure may be provided as a patterned layer, which comprises a recess that forms the cavity.

According to a further exemplary embodiment, the surrounding structure further comprises an electrically conductive layer, the electrically conductive layer at least partially covers the electrically insulating structure. In particular, wherein the electrically conductive layer at least partially covers the base structure below the electronic component. This may provide the advantage that the component carrier is even more robust and the heat dissipation is further improved. Furthermore, this step can be easily implemented into existing production lines.

The electrically conductive layer may be an additional coating layer, which may be applied in order to cover/coat the surface of the electrically insulating structure, and, optionally, also the region of the base structure, where the electronic component is to be placed. The electrically conductive layer may be formed by plating, electroplating, electro-less plating, and/or sputtering, for example with copper. The additional electrically conductive layer over the electrically insulating structure may also enhance the heat dissipation properties of the base structure. Furthermore, the whole component carrier may be further stiffened and/or made more robust by applying the additional electrically conductive layer coating. According to a further embodiment, the electrically conductive layer may also function as an electromagnetic radiation shielding functionality for the electronic component. In an embodiment, the electronic component is placed directly on the base structure, to provide a most efficient heat dissipation. In another embodiment, the electrically conductive layer is arranged between the electronic component and the base structure. Also, in this case, through the electrically conductive layer, an efficient dissipation of heat, produced by electronic component, is provided.

According to a further embodiment, the component carrier comprises a further electrically insulating structure on top of the surrounding structure. In particular, the further electrically insulating structure at least partially fills a gap between the electronic component and the surrounding structure, such that the electronic component is at least partially embedded in the component carrier. This may provide the advantage that a flexible build-up of layer structures can be realized in order to provide a component carrier with high functionality. Furthermore, this provides the advantage that the electronic component can be efficiently embedded in a low-cost manner.

The further electrically insulating structure may for example be one of an epoxy-based build-up material, PID, a mold film, prepreg, or a resin and may be formed with known build-up methods such as SAP. In a preferred embodiment, a gap between a sidewall of the electronic component and a sidewall of the surrounding structure is filled with the further electrically insulating structure material. Hereby the filling of the gap, and the formation of the further electrically insulating structure as an additional layer on top of the surrounding structure, are preferably fulfilled in one process step. By embedding the electronic component in the electrically insulating structure material, the electronic component is for example secured against mechanical stress.

According to a further exemplary embodiment, forming the base structure comprises electroplating and/or electro-less plating, in particular after forming a seed layer. This may provide that advantage that the method with its advantageous effects can be realized by employing well known and approved process technologies.

The term "plating" may denote a process of plating, i.e. covering of a conductive surface, in which process a metal is deposited onto the conductive surface. The term "plating" may refer to electro-plating. Further, the term "plating" may refer to galvanizing. Furthermore, the term "plating" may refer to electro-plating a surface of a preform of a component carrier with an electrically conductive material.

The term "electroplating", also termed galvanizing, refers to a process of deposition metallic ions onto a surface, which should be plated. Electroplating may take place in a bath and may comprise the use of an anode and a cathode. The anode (positively charged) may be placed into a bath in order to establish an electric field between the anode and a negatively charged entity, which should be electroplated, and which serves as a cathode. The electric field drives cations, such as copper ions, which are dissolved in the bath, to the surface of the entity, which should be electroplated. At the negatively charged surface, the cations will be chemically reduced and a layer of e.g. copper will start growing on the surface of the entity, which should be electroplated. This process can be used for forming a layer or filling a cavity.

"Electro-less plating" is also termed chemical or auto-catalytic plating and is a non-galvanic method that may involve several simultaneous reactions in a bath. For example, in a first place an electro-less plating step is performed in order to produce a conductive layer upon an electrically insulating layer of a component carrier. This electrically conductive layer is necessary for performing a subsequent electroplating step. This is because during an electro-plating process in a bath, the entity, which should be electroplated, is used as a cathode (negatively charged). The negative charge can be set e.g. by means of a power supply, which contacts the surface of the entity, which should be electroplated, e.g. with contact rings. However, this can only be done, if the surface of the entity is made of electrically conductive material. Therefore, electro-less plating may be mandatory in order to produce a thin electrically conductive material layer onto an electrically insulating material in a first step.

The term "seed layer" may refer to a thin layer (e.g. <1 µm) of metal (e.g. copper) that is plated on a surface or in cavities by a chemical reaction to obtain a conductive surface (e.g. using electro-less plating). The seed layer may be sputtered. Using sputtering, the layer may even be thinner than 0.5 µm, e.g. one or more layers of <0.2 µm may be achieved. A further, much thicker metal layer of (e.g. between 5 and 50 µm, in particular 15 and 35 µm) may then be electroplated on the seed layer by applying current onto the component carrier.

According to a further exemplary embodiment, the method further comprises: i) providing a detach core, in particular laminating the detach core, ii) forming the base structure on the detach core, and iii) removing the detach core. This may provide the advantage that the advantageous component carrier, in particular coreless component carrier, can be manufactured in an efficient manner.

A detach core may for example be a copper clad laminate (CCL) or any other suitable substrate that could be used as a temporary carrier for manufacturing a component carrier. The detach core may be laminated with a foil, e.g. a dielectric foil such as an epoxy-based build-up laminate. The base structure may be formed on the detach core, for example by electroplating the core with a thick copper layer. In an embodiment, the detach core may be fully surrounded by the layer, which may form the base structure. In this manner, two component carriers could be manufactured at the same time, each on one side of the detach core. During the manufacturing process of the component carrier(s), the detach core may be removed in order to yield one (or more) component carrier(s) with a base structure.

According to a further exemplary embodiment, a seed layer is formed on at least one of the detach core, a layer stack or a coreless carrier. Besides the described detach core, a layer stack or a coreless carrier could be used as a basis for forming the base structure of the component carrier. Hereby, the seed layer may be necessary for later-on forming the base structure by electroplating.

According to a further exemplary embodiment, forming the surrounding structure further comprises forming an electrically conductive structure on the base structure by electroplating and/or electro-less plating, in particular after forming a further seed layer.

According to a further exemplary embodiment, forming the surrounding structure further comprises i) forming an electrically insulating structure on the base structure, and ii) forming an electrically conductive layer on the base structure by electroplating and/or electro-less plating. Hereby, a seed layer may be provided on the electrically insulating structure by forming a thin metal layer by a chemical reaction and/or electro-less plating.

According to further exemplary embodiment, the method further comprises forming a cavity in the surrounding structure such that the electronic component can be placed through said cavity on the base structure, in particular wherein forming the cavity comprises at least one of laser drilling, sand-blasting or photolithography. This also may provide the advantage that the described method can be directly and easily implemented into existing production lines. The cavity-forming methods laser drilling, sand-blasting and photolithography are described in detail below in the text below referring to FIG. 2.

According to a further exemplary embodiment, the method further comprises forming a further electrically insulating structure, in particular by a SAP process, on the surrounding structure. This also may provide the advantage that the described method can be directly and easily implemented into existing production lines.

According to a further exemplary embodiment, forming the further electrically insulating structure further comprises: filling a gap between the electronic component and the surrounding structure with material of the electrically insulating structure such that the electronic component is at least partially embedded in the component carrier.

According to a further exemplary embodiment, the method further comprises: forming an interconnection path, in particular a via, at least partially through the further electrically insulating layer structure in order to electrically contact the electronic component, in particular in form of a redistribution structure.

A via (vertical interconnect access) is an electrical connection between layers in a physical electronic circuit that goes through the plane of one or more adjacent layers. The term via may include through-hole vias, buried vias, and blind vias. Microvias are used as interconnects between layers in high density interconnect (HDI) substrates and printed circuit boards (PCBs) to accommodate the high I/O density of advanced packages.

The electronic component may be electrically connected in a flexible and still robust manner, when via connections are formed within the component carrier. For example, the holes may be formed by laser drilling and may then be, at least partially, filled with electrically conductive material (e.g. by plating) such that efficient connections are enabled. Also, redistribution structures may be formed in this manner.

A redistribution layer (RDL) or redistribution structure may be an additional layer comprising an electrically conductive material (e.g. a metal layer) on an electronic component or a component carrier that makes I/O (input/output) pads of an integrated circuit available to other locations. When an integrated circuit is manufactured, it usually has a set of I/O pads that are electrically connected (e.g. wire-bonded) to the pins of a package. A redistribution layer may be a layer of wiring on the chip that enables a simpler chip-to-chip, chip-to-component carrier, or component carrier-to-component carrier bonding. In an embodiment, the terminals at the component carrier side of the redistribution layer are smaller than the terminals at the component carrier opposed side of the redistribution layer. For example, the redistribution layer may comprise solder balls and/or copper pillars at the side, which is facing away from the embedded component, in order to be connectable to another entity. In an exemplary embodiment, the electric contacts of the embedded electronic component may be small in size and a redistribution structure may hence be arranged below the electronic component. The redistribution structure may hereby be designed such that the small electric contacts of the electronic component are redistributed into terminals of a larger size, e.g. ball-shaped electric contacts (solder balls).

The electronic component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), a die, an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, a logic chip, a light guide, and an energy harvesting unit. However, other components may be embedded in or surface mounted on the component carrier. For example, a magnetic element can be used as a component. Such a magnetic element may be a permanent magnetic element (such as a ferromagnetic element, an antiferromagnetic element or a ferromagnetic element, for instance a ferrite coupling structure) or may be a paramagnetic element. However, the component may also be a substrate, an interposer or a further component carrier, for example in a board-in-board configuration. Moreover, also other components, in particular those which generate and emit electromagnetic radiation and/or are sensitive with regard to electromagnetic radiation propagating from an environment, may be used as component.

According to a further exemplary embodiment, the method further comprises: i) providing a first pre-form of a component carrier including the base structure, the electronic component, and the surrounding structure, ii) forming, next to the base structure and/or the first pre-form of a component carrier, a further base structure consisting of an electrically conductive material, iii) placing a further electronic component on the further base structure, iv) forming a further surrounding structure on the further base structure such that the further surrounding structure at least partially surrounds the further electronic component laterally, v) providing a second pre-form of a component carrier including the further base structure, the further electronic component, and the further surrounding structure, and vi) separating the first pre-form of a component carrier from the second of a component carrier. This step of singularization may provide the advantage that, at any suitable process stage, a plurality of pre-forms of component carriers (e.g. dies) can be separated from each other and can then be individually embedded into larger systems in a flexible and efficient manner.

In an embodiment, the at least one electrically insulating (layer) structure comprises at least one of the group consisting of resin (such as reinforced or non-reinforced resins, for instance epoxy resin or bismaleimide-triazine resin, cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up material, polytetrafluoroethylene (Teflon®), a ceramic, and a metal oxide. Teflon is a registered mark of the Chemours Company FC, LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing particles (such as spheres, in particular glass spheres).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as spheres, in particular glass spheres). Furthermore, the component carrier may be configured as a substrate-like-printed circuit board (SLP).

The substrate or interposer may consist of at least a layer of glass, silicon (Si) or a photo-imageable or dry-etchable organic material like epoxy-based build-up films or polymer compounds like polyimide, polybenzoxazole, or benzocyclobutene.

In an embodiment, the at least one electrically conductive layer structure and/or the electrically conductive structure comprises at least one of the group consisting of copper, aluminum, nickel, silver, gold, palladium, cobalt, and tungsten. Although copper is usually preferred, other materials or coated versions thereof are possible as well.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, there is provided an electronic component embedding substrate (e.g. a component carrier) including a metal carrier (e.g. base structure) manufactured via electroplating on a seed layer of a conventional (detach) core, wherein the electroplated copper layer (base structure) is used as a heat dissipation layer of the chip package (e.g. component embedded in the component carrier).

According to an exemplary embodiment of the invention, the following steps are performed: i) providing a detach core, ii) forming a thick (full) copper layer (electroplating and/or electro-less plating) around the core, iii) forming and patterning a PID (photo-imageable dielectric) layer on the thick copper layer such that there is a cavity in the PID layer iv) attaching a die in the cavity, v) forming a build-up layer of an epoxy-based build-up material on top of the PID layer and the die, vi) performing further build-up, patterning, and circuitization steps, in particular with respect to the embedded die, vii) performing an edge trim step, viii) detaching the core and copper recess, ix) forming solder resist and finish layer, and x) forming of bump-shaped contacts.

According to an exemplary embodiment of the invention, the following advantages are provided: thermal dissipation enhancement, warpage control with proper structure design, stiffness enhancement with a metal carrier, and using general coreless build-up process and material.

According to an exemplary embodiment of the invention, an adhesive material is used to fix the component in the cavity. Hereby, an adhesive film or an adhesive tape may be applied. Some examples include: a face-up die-attach, a backside die-attach, a die-attach film adhesive (with a thickness of e.g. 10 to 20 μm), an epoxy die-attach film adhesive (e.g. with a thickness of e.g. 10 to 20 μm), a non-epoxy based high temperature fill-in paste adhesive, a dicing die-attach film (DDAF), or a UV-curable adhesive (e.g. a die-attach film compatible with a UV release layer).

According to an exemplary embodiment of the invention, a UV tape is used as an adhesive material to fix the component in the cavity. The UV tape has strong adhesive strength and holds a component in place. The UV tape comprises a base polymer, an oligomer, and a photo initiator, wherein only the polymer has a polymerization structure. However, the adhesive strength becomes lower when irradiated with UV, because then the oligomer polymerizes and the tape becomes hard. Then, the chip can be easily removed.

According to an exemplary embodiment of the invention, the component carrier does not necessarily need to be coreless. A sacrificial layer may for example be used to build up a core, which subsequently could be further build up (symmetrically or asymmetrically), after removing the sacrificial layer.

According to an exemplary embodiment of the invention, before structuring/after structuring only a few layers, the individual preforms of component carriers (e.g. dies) could be singularized in order to then embed them into a bigger system (e.g. embedding a power package into a component carrier or an IC substrate with electronic component (e.g. chip) into a PCB.

FIGS. 1A to 1H illustrate exemplary embodiments of methods for manufacturing a component carrier 100.

Figure 1A:
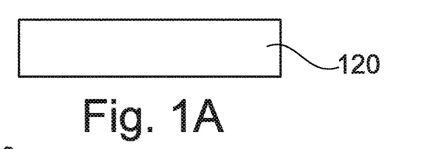
FIGS. 1A to 1H illustrate exemplary embodiments of methods for manufacturing a component carrier according to embodiments of the invention.

FIG. 1A: A base structure 120 consisting of an electrically conductive material is provided. The base structure 120 is hereby a metal layer, in particular a copper layer.

In the following steps, a surrounding structure 140 is formed on the base structure 120 such that the surrounding structure 140 at least partially surrounds an electronic component 110 (see below) laterally. The surrounding structure can hereby for example be formed by an electrically insulating structure 160 covered by an electrically conductive layer 165, as will be described with reference to FIGS. 1B to 1E, or for example by an electrically conductive structure 150, as will be described with reference to FIGS. 1F to 1H below.

Figure 1B:
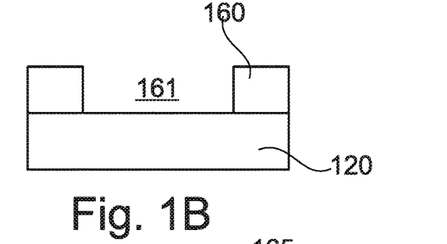

FIG. 1B: An electrically insulating structure 160 is formed on the base structure 120 as a layer, e.g. by lamination. The electrically insulating structure 160 is for example a layer of PID or an epoxy-based build-up material. Then cavity 161 is formed in the electrically insulating structure 160 such that an electronic component 110 can be placed, through said cavity 161, on the base structure 120. Forming the cavity 161 comprises hereby for example one of laser drilling, sand-blasting or photolithography (see FIG. 2 below).

Figure 1C:
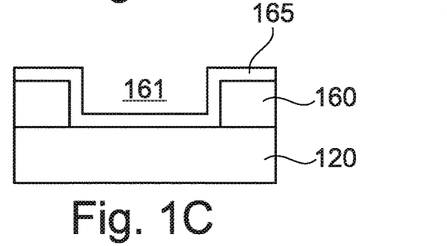

FIG. 1C: An electrically conductive layer 165, e.g. a copper layer, is formed on the electrically insulating structure 160 by electroplating and/or electro-less plating. The electrically conductive layer 165 covers the electrically insulating structure 160 and the base structure 120 at the bottom of the cavity 161. Optionally, the side walls of the cavity are also covered with the electrically conductive layer 165. In other words, there is a cavity formed in a dielectric structure and the cavity bottom is plated with metal. Optionally, the cavity walls are also covered with metal.

Figure 1D:
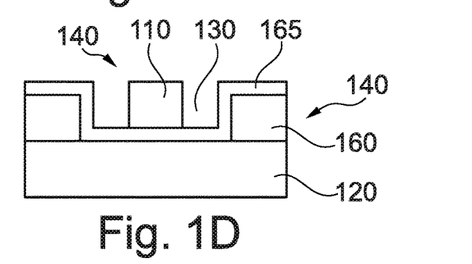

FIG. 1D: The electronic component 110 is then placed, through the cavity 161, on the base structure 120. In this manner, the surrounding structure 140, formed by the electrically insulating structure 160 covered by the electrically conductive layer 165, surrounds the electronic component 110 laterally. The electronic component 110 is shown to be placed on the electrically conductive layer 165, which is arranged between the electronic component 110 and the base structure 120. However, the electronic component 110 may as well be arranged directly on the base structure 120, and the space between electronic component 110 and base structure 120 is then not covered by the electrically conductive layer 165.

Figure 1E:
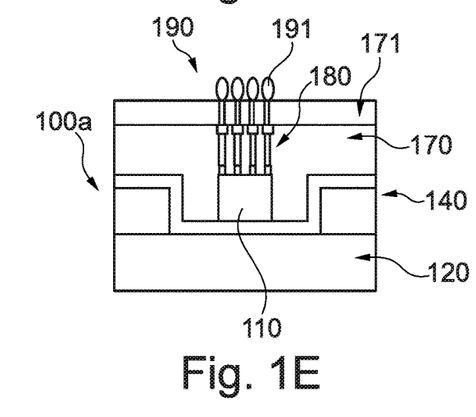

FIG. 1E: A further electrically insulating structure 170 is formed by a SAP (semi-additive) process on the surrounding structure 140. Hereby, a gap 130 between the electronic component 110 and the surrounding structure 140 is also filled with the material of the electrically insulating structure 170 such that the electronic component 110 is embedded in the component carrier 100. A layer of solder resist 171 can also be arranged above the electrically insulating structure 170. Furthermore, a plurality of interconnection paths 180, i.e. vias, are formed through the further electrically insulating structure 170 in order to electrically contact the embedded electronic component 110. While the electronic component 110 comprises small electric contacts, these are connected via the interconnection paths 180 to large ball-shaped contacts 191 at the surface of the component carrier 100a. The final component carrier 100a is thereby provided with a redistribution structure 190 with respect to the embedded electronic component 110. In an exemplary embodiment, a plurality of redistribution layers and via interconnections can be formed in order to fan out from very small pads on the electronic component 110 to substantially larger pads/ball-shaped contacts 191.

Figure 1F:
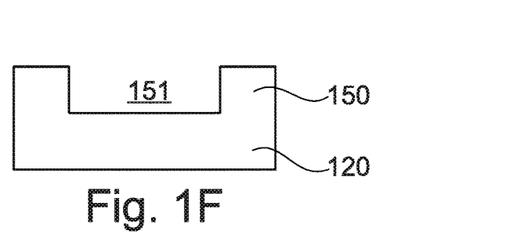

FIG. 1F: According to the second alternative, the surrounding structure 140 is provided by forming an electrically conductive structure 150 on the base structure 120 by electroplating and/or electro-less plating. Then, the cavity 151 is formed in the electrically conductive structure 150 such that an electronic component 110 can be placed, through said cavity 151, on the base structure 120. In other words, a cavity is formed in a metal layer structure (e.g. copper).

Figure 1G:
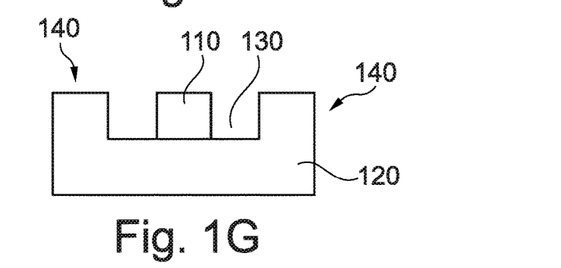

FIG. 1G: The electronic component 110 is then placed, through the cavity 151, on the base structure 120. In this manner, the surrounding structure 140, formed by the electrically conductive structure 150, surrounds the electronic component 110 laterally. The electronic component 110 is shown to be placed directly on the base layer 120.

Figure 1H:
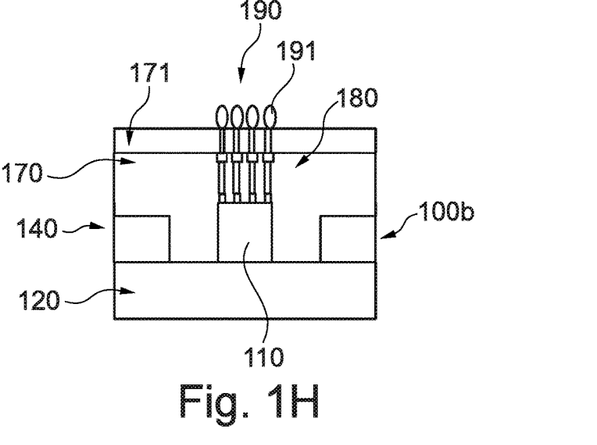

FIG. 1H: A further electrically insulating structure 170 is formed by a SAP process on the surrounding structure 140. Hereby, a gap 130 between the electronic component 110 and the surrounding structure 140 is also filled with the material of the electrically insulating structure 170 such that the electronic component 110 is embedded in the component carrier 100. Furthermore, a plurality of interconnection paths 180, i.e. vias, are formed through the further electrically insulating structure 170 in order to electrically contact the embedded electronic component 110. While the electronic component 110 comprises small electric contacts, these are connected via the interconnection paths 180 to large ball-shaped contacts 191 at the surface of the component carrier 100*b*. The final component carrier 100*b* is thereby provided with a redistribution structure 190 with respect to the embedded electronic component 110. In an exemplary embodiment, a plurality of redistribution layers and via interconnections can be formed in order to fan out from very small pads on the electronic component 110 to substantially larger pads/ball-shaped contacts 191.

FIGS. 2A to 2D illustrate examples of forming a cavity in a component carrier.

Figures 2A, 2C:
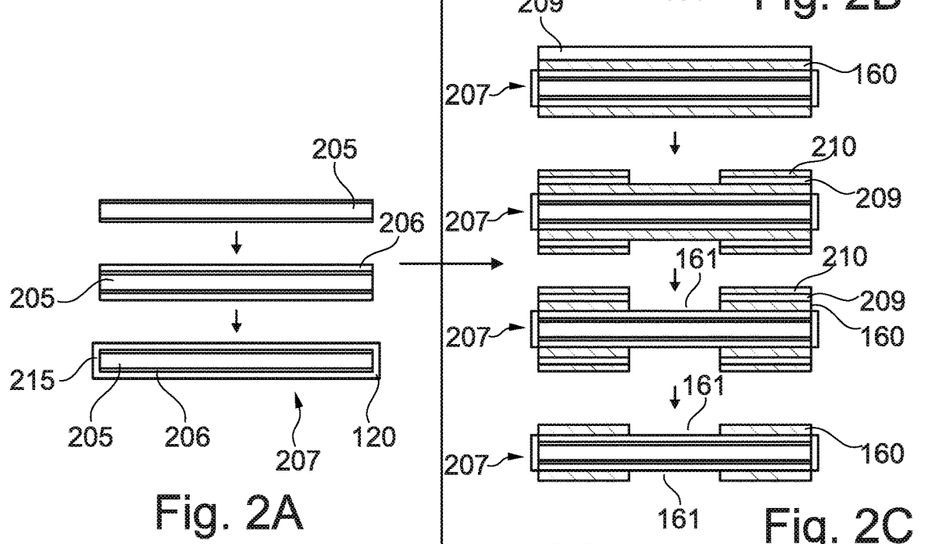
FIGS. 2A to 2D illustrate exemplary embodiments of forming a cavity in a component carrier according to embodiments of the invention.

FIG. 2A: A detach core 205 is provided and optionally laminated with a foil 206, e.g. with a prepreg foil or an epoxy-based build-up material. Then, the detach core 205 is copper plated, in particular by electroplating and/or electro-less plating in order to obtain a copper structure. This copper structure forms a base structure 120 at the plated core 207. In case that no foil is used, the copper layer may be formed thicker.

Figure 2B:
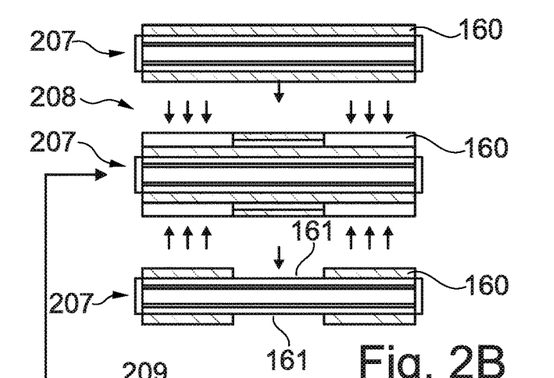

FIG. 2B: In a first step, the plated core 207 is laminated with an electrically insulating structure 160, in particular PID. In a second step, a mask 208 is positioned over the laminated plated core 207 such that, when a photolithography is applied, the cavity 161 is formed. A third step is a development step.

FIG. 2C: In a first step, the plated core 207 is laminated with an electrically insulating structure 160, in particular a mold film, and a metal layer 209, e.g. copper foil. In a second step, a dry film 210 is attached over the metal layer 209 and the metal layer 209 at the cavity position is removed by etching. In a third step, the electrically insulating structure 160 at the cavity position is removed by sand-blasting in order to obtain the cavity 161. In a last step, the dry film 210 and the metal layer 209 are removed by etching.

Figure 2D:
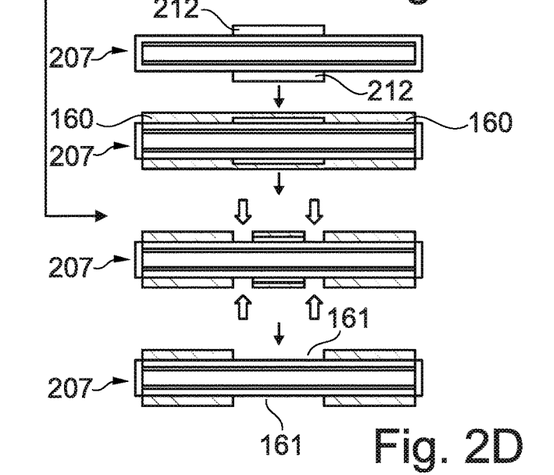

FIG. 2D: In a first step, an adhesive print or taping 212 is attached at a cavity position to the plated core 207. In a second step, the plated core 207 is laminated with an electrically insulating structure 160, in particular a mold film or prepreg, and a metal layer 209, e.g. a copper foil. In a third step, a laser, e.g. a $CO_2$ laser, is used to drill through the metal layer 209 and the electrically insulating structure 160. The material at the cavity position is now only held in place by the adhesive tape 212 and can be easily separated from the layer stack in order to obtain the cavity 161.

FIGS. 3A to 3K illustrate a method for manufacturing a component carrier according to a first exemplary embodiment of the invention.

Figure 3A:
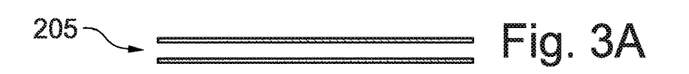
FIGS. 3A to 3K illustrate a method for manufacturing a component carrier according to a first exemplary embodiment of the invention.

FIG. 3A: A detach core 205 is provided.

Figure 3B:
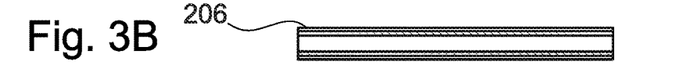

FIG. 3B: The detach core 205 is optionally laminated 206, e.g. with a prepreg foil or an epoxy-based build-up material.

Figure 3C:
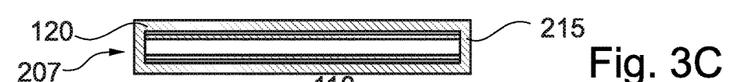

FIG. 3C: The detach core 205 is copper plated, in particular by electroplating and/or electro-less plating in order to obtain a copper structure. In case that no laminate is used, a thicker copper structure may be applied. This copper structure forms a base structure 120 at the plated core 207. Then, an electrically insulating structure 160, e.g. PID, is laminated on the base structure 120 and a cavity 161 is formed in the electrically insulating structure 160 as has already been described above for the examples in FIGS. 1 and 2. The electrically insulating structure 160 is then optionally covered with an electrically conductive layer 165.

Figures 3D, 3E:
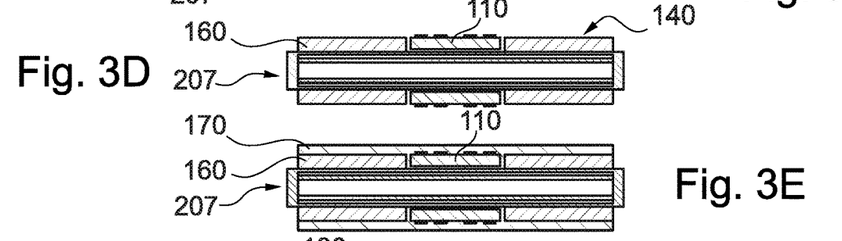

FIG. 3D: An electronic component 110 is placed into the cavity 161 such that the electronic component 110 is arranged on the base structure 120 and such that the electrically insulating structure 160 (and optionally also the electrically conductive layer 165) form a surrounding structure 140 which laterally surrounds the electronic component 110. Hereby, an adhesive (e.g. a film, a tape, or a paste) is used to fix the electronic component 110 in the cavity 161.

At this process stage, in particular at the present process step or at any one of the following process steps, a plurality of the described pre-forms of component carriers (e.g. dies) can be singularized. This singularization before further structuring/build-up may have the advantage that individual pre-forms of component carriers can be efficiently embedded into larger systems.

FIG. 3E: A further electrically insulating structure 170, e.g. an epoxy-based build-up material, PID, or a mold film, is formed by a SAP process on the surrounding structure 140. Hereby, a gap 130 between the electronic component 110 and the surrounding structure 140 is also filled with the material of the electrically insulating structure 170 such that the electronic component 110 is embedded in the component carrier 100.

Figure 3F:
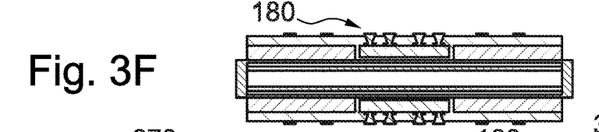

FIG. 3F: A plurality of interconnection paths 180, i.e. vias, are formed through the further electrically insulating structure 170 in order to electrically contact the embedded electronic component 110.

Figure 3G:
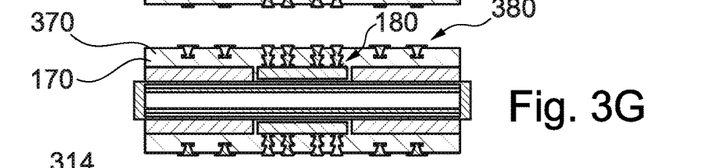

FIG. 3G: Optionally, another electrically insulating structure 370 is provided and further interconnection paths 380, i.e. via, are formed.

Figure 3H:
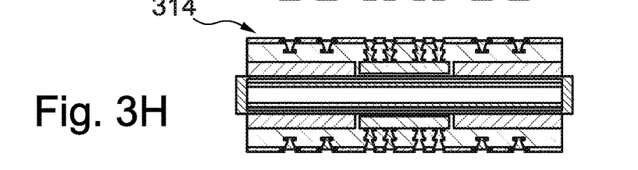

FIG. 3H: A layer of solder resist (solder mask) 314 and a surface finish are provided.

Figure 3I:
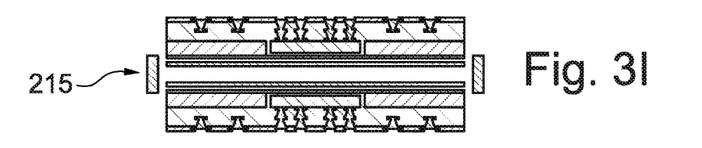

FIG. 3I: An edge trim step is performed in order to remove lateral portions 215 of the plated core 207.

Figure 3J:
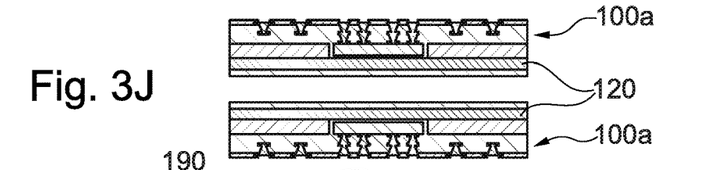

FIG. 3J: The detach core 205 is now removed such that two component carriers 100*a*, each on a base structure 120, are obtained.

Figure 3K:
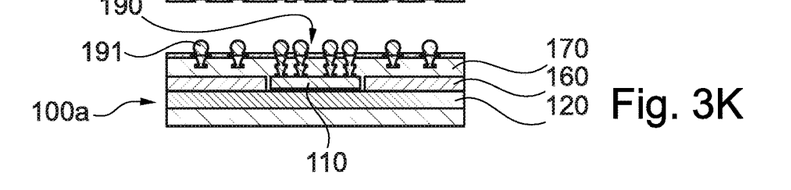

FIG. 3K: The final component carrier 100*a* is provided with ball-shaped contacts 191 in order to provide a redistribution structure 190 with respect to the embedded electronic component 110.

FIGS. 4A to 4K illustrate a method for manufacturing a component carrier according to a second exemplary embodiment of the invention.

Figures 4A, 4B:
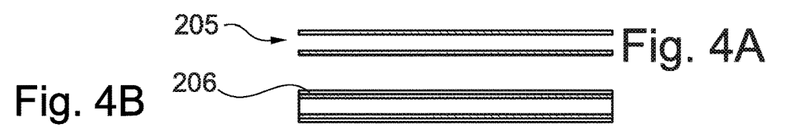
FIGS. 4A to 4K illustrate a method for manufacturing a component carrier according to a second exemplary embodiment of the invention.

FIG. 4A: A detach core 205 is provided.

FIG. 4B: The detach core 205 is optionally laminated 206, e.g. with a prepreg foil or an epoxy-based build-up material (foil).

Figures 4C, 4D, 4E:
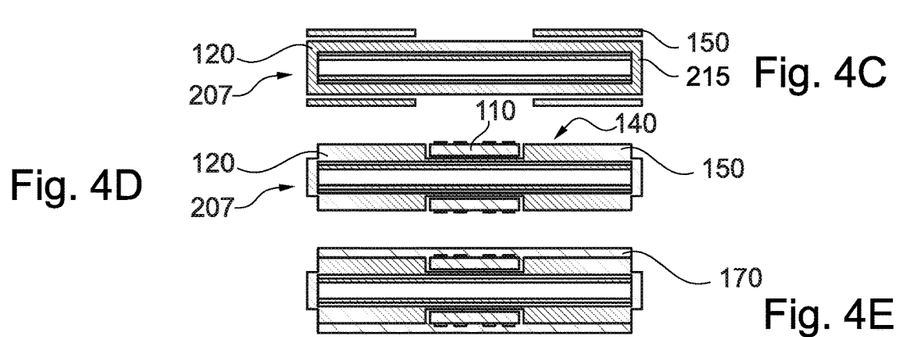

FIG. 4C: The detach core 205 is copper plated, in particular by electroplating and/or electro-less plating in order to obtain a copper structure. In case that no laminate is used, a thicker copper structure is formed. This copper structure forms a base structure 120 at the plated core 207. Then, an electrically conductive structure 150 is arranged, in particular plated, on the base structure 120. The electrically conductive structure 150 is either plated so that a cavity 151 remains in a center position, or the electrically conductive structure 150 is arranged as a continuous layer followed by an additional step of forming the cavity 151.

FIG. 4D: An electronic component 110 is placed into the cavity 151 (and fixed using an adhesive) such that the electronic component 110 is arranged on the base structure 120 and such that the electrically conductive structure 150 forms a surrounding structure 140 which laterally surrounds the electronic component 110.

At this process stage, in particular at the present process step or at any one of the following process steps, a plurality of the described pre-forms of component carriers (e.g. dies) can be singularized. This singularization before further structuring/build-up may have the advantage that individual pre-forms of component carriers can be efficiently embedded into larger systems.

FIG. 4E: An electrically insulating structure 170, e.g. an epoxy-based build-up material, PID, or a mold film, is formed by a SAP process on the surrounding structure 140. Hereby, a gap 130 between the electronic component 110 and the surrounding structure 140 is also filled with the material of the electrically insulating structure 170 such that the electronic component 110 is embedded in the component carrier 100.

Figures 4F, 4G:
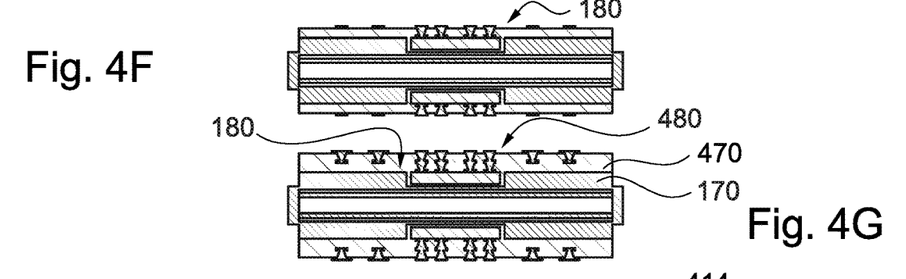

FIG. 4F: A plurality of interconnection paths 180, i.e. vias, are formed through the electrically insulating structure 170 in order to electrically contact the embedded electronic component 110.

FIG. 4G: Optionally, another electrically insulating structure 470 is provided and further interconnection paths 480, i.e. vias, are formed.

Figure 4H:
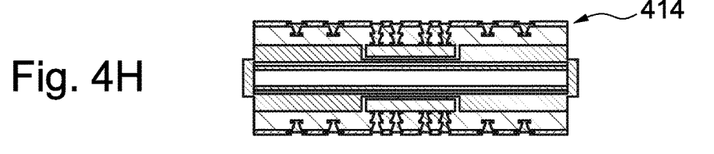

FIG. 4H: A layer of solder resist (solder mask) 414 and a surface finish are provided.

Figure 4I:
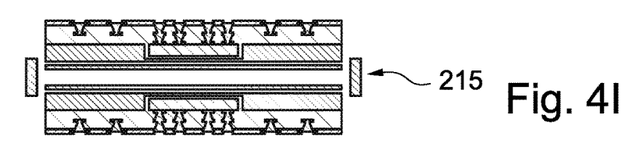

FIG. 4I: An edge trim step is performed in order to remove lateral portions 215 of the plated core 207.

Figure 4J:
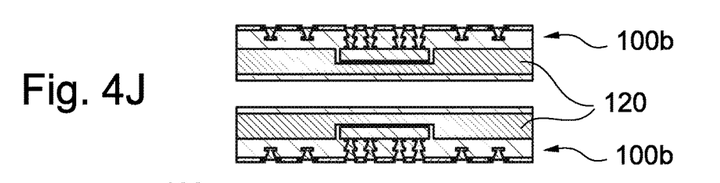

FIG. 4J: The detach core 205 is now removed such that two component carriers 100b, each on a base structure 120, are obtained.

Figure 4K:
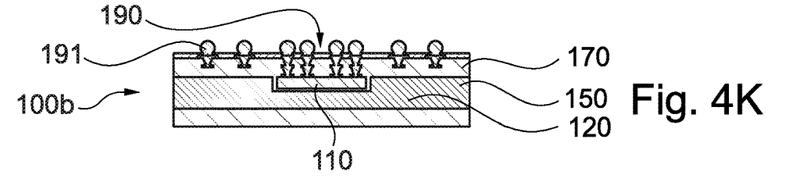

FIG. 4K: The final component carrier 100b is provided with ball-shaped contacts 191 in order to provide a redistribution structure 190 with respect to the embedded electronic component 110.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS 100, 100a, 100b Component carrier
110 Electronic component
120 Base structure
130 Gap
140 Surrounding structure
150 Electrically conductive structure
151, 161 Cavity
160 Electrically insulating structure
165 Electrically conductive layer
170, 370, 470 Further electrically insulating structure
171 Solder resist
180, 380, 480 Interconnection path, via(s)
190 Redistribution structure
191 Ball-shaped contact
205 Detach core
206 Laminate
207 Plated core
208 Mask
209 Metal layer
210 Dry film
212 Adhesive tape
215 Lateral portion of plated core
314, 414 Solder resist

The invention claimed is:

1. A component carrier, wherein the component carrier is one of the group which consists of a printed circuit board, an organic interposer, a substrate-like-PCB, an IC substrate, comprising:
   a base structure consisting of an electrically conductive material;
   an electronic component arranged on the base structure, wherein the electronic component is selected from a group consisting of an electrically non-conductive inlay, an electrically conductive inlay, a heat transfer unit, a die, an active electronic component, a passive electronic component, a filter, an integrated circuit, a signal processing component, a power management component, a voltage converter, a cryptographic component, an electromechanical transducer, a sensor, an actuator, a microelectromechanical system (MEMS), a microprocessor, a capacitor, a resistor, an inductance, a battery, a switch, a camera, a logic chip, an energy harvesting unit, a magnetic element, a substrate, an interposer, a further component carrier;
   a surrounding structure on the base structure,
   wherein the surrounding structure at least partially surrounds the electronic component laterally,
   wherein the surrounding structure comprises an electrically insulating structure which is formed as a layer structure on the base structure,
   wherein the electrically insulating structure comprises a cavity, and
   wherein the electronic component is arranged in said cavity; and
   an electrically conductive layer,
   wherein the electrically conductive layer at least partially covers the electrically insulating structure, and
   wherein the electrically conductive layer at least partially covers the base structure below the electronic component, so that a part of the electrically conductive layer is arranged between the electronic component and the base structure;
   a further electrically insulating layer structure on top of the surrounding structure,
   wherein the further electrically insulating layer structure at least partially fills a gap between the electronic component and the surrounding structure such that the electronic component is at least partially embedded in the component carrier;
   wherein the component carrier further comprises a plurality of vias formed at least partially through the further electrically insulating layer structure,
   wherein the plurality of vias form a redistribution structure, and
   wherein at least a part of the plurality of vias is arranged directly on a main surface of the embedded electronic component.

2. The component carrier according to claim 1, wherein the component carrier is a coreless component carrier.

3. The component carrier according to claim 1, wherein the electrically conductive layer covers the sidewalls of the cavity.

4. The component carrier according to claim 1,
wherein the further electrically insulating structure comprises prepreg material.

5. The component carrier according to claim 1,
wherein the further electrically insulating layer structure comprises at least one of the group consisting of epoxy resin, bismaleimide-triazine resin, cyanate ester, polyphenylene derivate, glass, FR-4, FR-5, polyimide, polyamide, liquid crystal polymer, epoxy-based build-up material, polytetrafluoroethylene, a ceramic, and a metal oxide.

6. A method for manufacturing a component carrier, the method comprising:
forming a base structure consisting of an electrically conductive material;
forming a surrounding structure on the base structure, the surrounding structure being electrically insulating and defining a cavity;
forming an electrically conductive layer that at least partially covers the surrounding structure and at least partially covers the base structure;
introducing an electronic component in the cavity such that a part of the electrically conductive layer is arranged between the electronic component and the base structure,
wherein the electronic component is selected from a group consisting of an electrically non-conductive inlay, an electrically conductive inlay, a heat transfer unit, a die, an active electronic component, a passive electronic component, a filter, an integrated circuit, a signal processing component, a power management component, a voltage converter, a cryptographic component, an electromechanical transducer, a sensor, an actuator, a microelectromechanical system (MEMS), a microprocessor, a capacitor, a resistor, an inductance, a battery, a switch, a camera, a logic chip, an energy harvesting unit, a magnetic element, a substrate, an interposer, a further component carrier;
applying a further electrically insulating layer structure on top of the surrounding structure,
wherein the further electrically insulating layer structure is not optically transparent and at least partially fills a gap between the electronic component and the surrounding structure such that the electronic component is at least partially embedded in the component carrier;
wherein the component carrier further comprises a plurality of vias formed at least partially through the further electrically insulating layer structure,
wherein the plurality of vias form a redistribution structure, and
wherein at least a part of the plurality of vias is arranged directly on a main surface of the embedded electronic component.

7. The method according to claim 6, wherein forming the base structure comprises:
electroplating and/or electro-less plating.

8. The method according to claim 6, wherein the method further comprises:
providing a detach core;
forming the base structure on the detach core; and
removing the detach core.

9. The method according to claim 8, wherein a seed layer is formed on at last one of the detach core, a layer stack or a coreless carrier.

10. The method according to claim 6, wherein forming the electrically conductive structure further comprises:
electroplating and/or electro-less plating.

11. The method according to claim 6, wherein the method further comprises:
forming the cavity in the surrounding structure such that the electronic component can be placed, through said cavity, on the base structure.

12. The method according to claim 11, wherein forming the cavity comprises at least one of laser drilling, sandblasting or photolithography.

13. The method according to claim 6, wherein the method further comprises:
forming a further electrically insulating structure, in particular by a SAP process, on the surrounding structure.

14. The method according to claim 13, wherein forming the further electrically insulating structure further comprises:
filling a gap between the electronic component and the surrounding structure with material of the electrically insulating structure such that the electronic component is at least partially embedded in the component carrier.

15. The method according to claim 13, wherein the method further comprises:
forming an interconnection path, in particular a via, at least partially through the further electrically insulating layer structure in order to electrically contact the electronic component to a redistribution structure.

16. The method according to claim 6, wherein the method further comprises:
providing a first pre-form of a component carrier including the base structure, the electronic component, and the surrounding structure;
forming, next to the base structure and/or the first pre-form of a component carrier, a further base structure consisting of an electrically conductive material;
placing a further electronic component on the further base structure;
forming a further surrounding structure on the further base structure such that the further surrounding structure at least partially surrounds the further electronic component laterally;
providing a second pre-form of a component carrier including the further base structure, the further electronic component, and the further surrounding structure; and
separating the first pre-form of a component carrier from the second of a component carrier.

17. A method of using a copper layer, the method comprising:
providing a base structure consisting of an electrically conductive material;
fabricating a surrounding structure of an electrically insulating material on the base structure, the surrounding structure defining a cavity;
fabricating the copper layer by electroplating such that the copper layer at least partially covers the surrounding structure and at least partially covers the base structure; and
arranging an electronic component in the cavity on the copper layer, wherein the surrounding structure at least partially surrounds the electronic component,
wherein the electronic component is selected from a group consisting of an electrically non-conductive inlay, an electrically conductive inlay, a heat transfer unit, a die, an active electronic component, a passive electronic component, a filter, an integrated circuit, a signal processing component, a power management component, a voltage converter, a cryptographic component, an electromechanical transducer, a sensor, an actuator, a microelectromechanical system (MEMS), a microprocessor, a capacitor, a resistor, an inductance, a battery, a switch, a camera, a logic chip, an energy harvesting unit, a magnetic element, a substrate, an interposer, a further component carrier;

wherein the copper layer directly contacting the electronic component and arranged between the electronic component and the base structure in a component carrier is a heat dissipation and stiffening structure for said component carrier;

applying a further electrically insulating layer structure on top of the surrounding structure, wherein the further electrically insulating layer structure is not optically transparent at least partially fills a gap between the electronic component and the surrounding structure such that the electronic component is at least partially embedded in the component carrier;

wherein the component carrier further comprises a plurality of vias formed at least partially through the further electrically insulating layer structure, wherein the plurality of vias form a redistribution structure, and wherein at least a part of the plurality of vias is arranged directly on a main surface of the embedded electronic component.

18. The method of using according to claim 17, wherein the component carrier is a coreless component carrier.

\* \* \* \* \*